(12) United States Patent
Park et al.

(10) Patent No.: US 7,916,542 B2
(45) Date of Patent: Mar. 29, 2011

(54) NONVOLATILE MEMORY DEVICE WITH MULTIPLE PAGE REGIONS, AND METHODS OF READING AND PRECHARGING THE SAME

(75) Inventors: Ki-Tae Park, Seongnam-si (KR); Hyun-Kyoung Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 305 days.

(21) Appl. No.: 12/236,771

(22) Filed: Sep. 24, 2008

(65) Prior Publication Data

US 2009/0091981 A1 Apr. 9, 2009

(30) Foreign Application Priority Data

Oct. 8, 2007 (KR) .................. 10-2007-0100962

(51) Int. Cl.
*G11C 11/34* (2006.01)
(52) U.S. Cl. .......... 365/185.12; 365/185.22; 365/185.25
(58) Field of Classification Search ............. 365/185.12, 365/185.11, 185.13, 185.22, 185.23, 185.25
See application file for complete search history.

(56) References Cited

U.S. PATENT DOCUMENTS

| | | | |
|---|---|---|---|
| 5,089,992 A * | 2/1992 | Shinohara | 365/51 |
| 5,867,429 A | 2/1999 | Chen et al. | |
| 7,224,611 B2 * | 5/2007 | Yamamoto et al. | 365/185.21 |
| 7,508,691 B2 * | 3/2009 | Gupta et al. | 365/63 |
| 7,535,761 B2 * | 5/2009 | Park et al. | 365/185.12 |

FOREIGN PATENT DOCUMENTS

| | | |
|---|---|---|
| JP | 08-185698 | 7/1996 |
| KR | 100173935 B1 | 11/1998 |
| KR | 1020060099149 A | 9/2006 |
| KR | 1020070000781 A | 1/2007 |

\* cited by examiner

*Primary Examiner* — Richard Elms
*Assistant Examiner* — Hien N Nguyen
(74) *Attorney, Agent, or Firm* — Volentine & Whitt, P.L.L.C.

(57) ABSTRACT

A nonvolatile memory device includes a memory cell array having multiple memory cells arranged at intersections of word lines and bit lines, a first page region configured with at least two adjacent memory cells coupled to a word line, and a second page region configured with at least two adjacent memory cells coupled to the word line. The nonvolatile memory devices also includes a first common source line connecting with the memory cells of the first page region, and a second common source line connecting with the memory cells of the second page region. The first and second common source lines are controlled independently.

14 Claims, 15 Drawing Sheets

Fig. 9
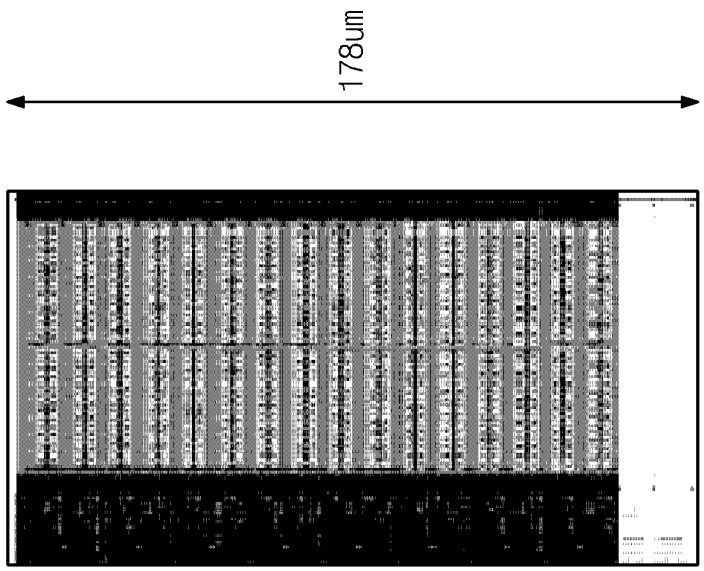
(b) 178um
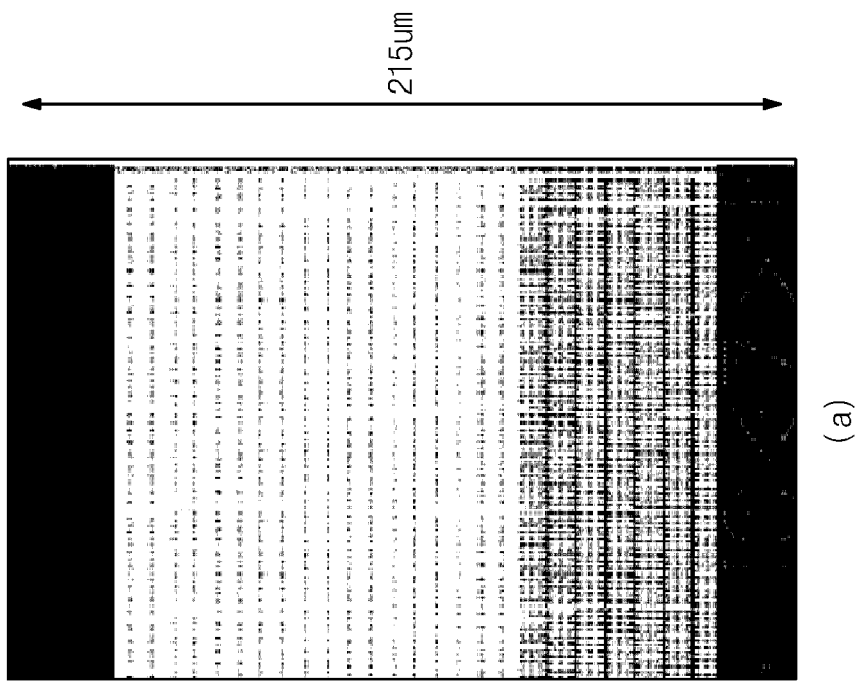
(a) 215um

NONVOLATILE MEMORY DEVICE WITH MULTIPLE PAGE REGIONS, AND METHODS OF READING AND PRECHARGING THE SAME

PRIORITY CLAIM

A claim of priority is made to Korean Patent Application No. 10-2007-0100962, filed on Oct. 8, 2007, in the Korean Intellectual Property Office, the subject matter of which is hereby incorporated by reference.

SUMMARY

Embodiments of the present invention relate to nonvolatile memory devices, and more particularly, to a nonvolatile memory device having multiple page regions and methods of reading and precharging the same.

Nonvolatile memories retain stored data even when power supply is interrupted. Among nonvolatile memories, flash memories are widely employed in computers and memory cards, since they are able to electrically erase data from memory cells at a time.

Flash memories can be generally classified as NOR and NAND types, based on logical connections between memory cells and bit lines. NOR-type flash memories provide high frequency operation, but have lower integration density because of large current consumption. NAND-type flash memories have high integration density, since they dissipate less current than NOR-type flash memories.

Many applications with storage units use volatile and nonvolatile memories, particularly in mobile devices, such as MP3 players, portable multimedia players (PMPs), mobile phones, laptop computers, personal digital assistants (PDA), and so forth. Such mobile devices are requiring large-capacity reservoirs for providing various functions (e.g., playing motion pictures).

Efforts to extend storage capacity include multi-bit memories capable of storing two or more bit data in a unit memory cell. A unit memory cell storing multi-bit data may be referred to as a multi-level cell (MLC). Other efforts to provide large capacity memory devices include integrating more memory cells on a unit circuit field, based on advancements in processing technology.

Embodiments of the present invention are directed to nonvolatile memory devices capable of reducing coupling capacitance between adjacent bit lines during programming operations, as well as reducing read disturbance and/or power consumption during reading operations. Embodiments of the present invention are also directed to nonvolatile memory devices including bit-line switch circuits scaled down in layout size.

For example, nonvolatile memory devices according to various embodiments of the present invention may include bit-line switch circuits operating independently of each other. Also, isolation transistors may be used to scale down layout sizes of the bit-line switch circuits, and common source lines may be divisionally driven in order to reduce read disturbance during a reading operation.

An aspect of the present invention provides a nonvolatile memory device that has a memory cell array having multiple memory cells arranged at intersections of word lines and bit lines, a first page region configured with at least two adjacent memory cells coupled to a word line, and a second page region configured with at least two adjacent memory cells coupled to the word line. The nonvolatile memory devices includes a first common source line connecting with the memory cells of the first page region, and a second common source line connecting with the memory cells of the second page region. The first and second common source lines are controlled independently.

During a read/verifying operation of the first page region, a ground voltage may be applied to the first common source line and a predetermined voltage or a power source voltage may be applied to the second common source line.

During the read/verifying operation of the first page region, the ground voltage may be applied to unselected bit lines. Also, the read/verifying operation of the first page region, unselected bit lines may be floated and/or precharged to a predetermined voltage level.

Another aspect of the present invention provides a nonvolatile memory device that has a memory cell array including memory cells arranged at intersections of word lines and bit lines, a first page region configured with at least two adjacent memory cells coupled to a word line, and a second page region configured with at least two adjacent memory cells coupled to the word line. The nonvolatile memory device includes a latch circuit for providing first page data to the first page region in response to a first address and subsequently providing second page data to the second page region in response to a second address, and a bit-line switch circuit between the memory cell array and the latch circuit. The bit-line switch circuit includes a first bit-line switch circuit for selecting bit lines to load the first page data into the first page region in response to the first address during a programming operation, and a second bit-line switch circuit for selecting bit lines to load the second page data into the second page region in response to the second address. The first address is different from the second address.

The latch circuit may include first latches, each of which is shared by a first pair of bit lines belonging to the first and second page regions, respectively, and second latches, each of which is shared by a second pair of bit lines belonging to the first and second page regions, respectively.

During the programming operation, the first bit-line switch circuit may select bit lines connected to the second latches after selecting bit lines connected to the first latches in response to the first address. Also, the second bit-line switch circuit may select bit lines connected to the first latches after selecting bit lines connected to the second latches in response to the second address.

The nonvolatile memory device may further include a first control logic circuit operating to control the first bit-line switch circuit in response to the first address, and a second control logic circuit operating to control the second bit-line switch circuit in response to the second address. The first and second control logic circuits may control the first and second bit-line switch circuits to select even and odd bit lines at the same time in response to a selected one of the addresses during a reading/verifying operation.

The first and second control logic circuits may control the first and second bit-line switch circuits to ground all of even and odd bit lines in response to a selected one of the addresses during a reading/verifying operation. Also, the first and second control logic circuits may be independently driven in compliance each of the first and second addresses.

The first bit-line switch circuit may include first even switches selecting even bit lines of the first page region in response to a first selection signal, and first odd switches selecting odd bit lines of the first page region in response to a second selection signal. The second bit-line switch circuit may include second even switches selecting even bit lines of the second page region in response to a third selection signal, and second odd switches selecting odd bit lines of the second page region in response to a fourth selection signal.

One of the first even switches and one of the first odd switches may be formed in a single active region. The even and odd switches may be separated from each other by isolation transistors. Also, a voltage applied to a gate of each of the isolation transistors may be equal to or less than a source-drain voltage of the isolation transistor to turn off each of the isolation transistors in a normal operation.

The first bit-line switch circuit may include first even bit-line selection lines to which the first selection signal is transferred; first odd bit-line selection lines to which the second selection signal is transferred; and first bit-line isolation lines between the first even and odd bit-line selection lines that are arranged alternately. The second bit-line switch circuit may include second even bit-line selection lines to which the third selection signal is transferred; second odd bit-line selection lines to which the fourth selection signal is transferred; and second bit-line isolation lines between the second even and odd bit-line selection lines that are arranged alternately. The first and second bit-line isolation lines may transfer the voltage that is applied to the gates of the isolation transistors.

The bit-line switch circuit may further include a first interconnection line leading from the first latch of the latch circuit and a second interconnection line leading from the second latch of the latch circuit. The first bit-line switch circuit may further include a first active region in which the first interconnection line is connected to a first contact, the second interconnection line is connected to a second contact, and bit lines connected to at least two adjacent memory cells of the first page region are connected to third and fourth contacts. The second bit-line switch circuit may further include a second active region in which the first interconnection line is connected to a fifth contact, the second interconnection line is connected to a sixth contact, and bit lines connected to at least two adjacent memory cells of the second page region are connected to seventh and eighth contacts. The first even bit-line selection line may be positioned between the first and third contacts in an upper portion of the first active region and the first odd bit-line selection line may be positioned between the second and fourth contacts in a lower portion of the first active region. The second even bit-line selection line may be positioned between the fifth and seventh contacts in an upper portion of the second active region and the second odd bit-line selection line may be positioned between the sixth and eighth contacts in a lower portion of the second active region.

The nonvolatile memory device may further include metal lines formed between the first interconnection line and the first and fifth contacts, and between the second interconnection line and the second and sixth contacts, intersecting the bit lines.

Another aspect of the present invention provides a precharging method for a nonvolatile memory device. The method includes precharging even bit lines of a first page region, having at least two adjacent memory cells; precharging odd bit lines of the first page region; precharging even bit lines of a second page region, having at least two adjacent memory cells; and precharging odd bit lines of the second page region. The first and second page regions are coupled to the same word line and addresses of the first and second page regions are different from each other.

The method may further include grounding the odd bit lines of the first page region and all of the bit lines of the second page region while precharging the even bit lines of the first page region.

The method may further include grounding the even bit lines of the first page region and all of the bit lines of the second page region while precharging the odd bit lines of the first page region.

Another aspect of the present invention provides a reading method for a nonvolatile memory device having multiple page regions coupled to a word line. The method includes precharging selected bit lines and floating unselected bit lines or precharging the unselected bit lines to a predetermined voltage level. The page regions are respectively activated by addresses different from each other. Also, common source lines corresponding to the page regions are driven independently.

The method may further include connecting a ground voltage to a common source line of a page region including the selected bit lines, and applying a predetermined precharging voltage to common source lines of page regions including the unselected bit lines.

According to embodiments of the present invention, the bit-line switch circuits may be driven by group, preventing unselected bit lines from being inadvertently precharged during the programming operation. Also, common source lines may be independently driven by memory cell region.

BRIEF DESCRIPTION OF THE DRAWINGS

The embodiments of the present invention will be described with reference to the attached drawings, wherein like reference numerals refer to like parts unless otherwise specified, and in which:

FIGS. 9(a) and 9(b) is a comparison showing layout sizes of bit-line switch circuits of nonvolatile memory devices;

DETAILED DESCRIPTION OF THE EMBODIMENTS

Figure 1:
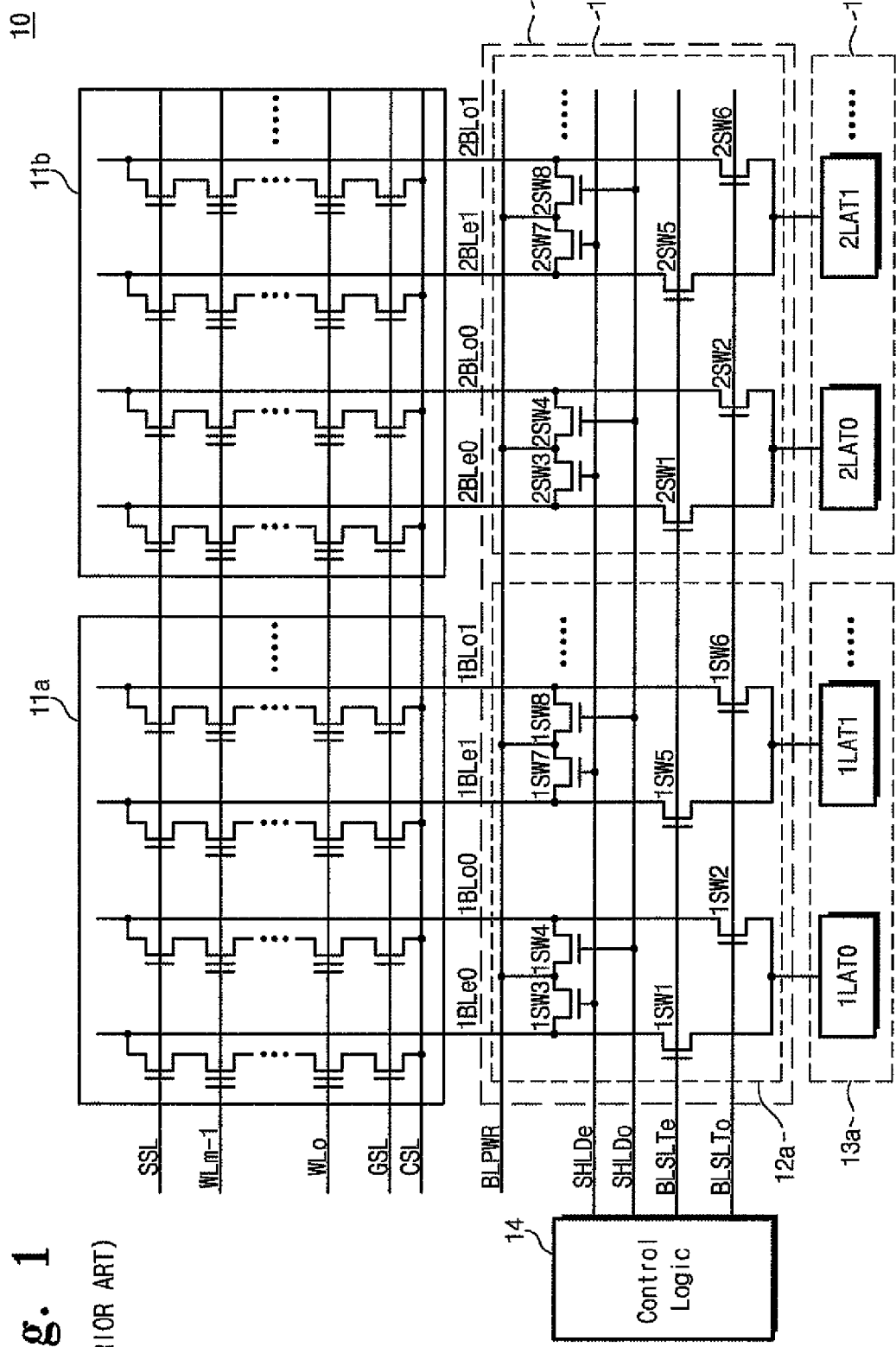
FIG. 1 is a circuit diagram showing an array of a generic nonvolatile memory device.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Figure 10:
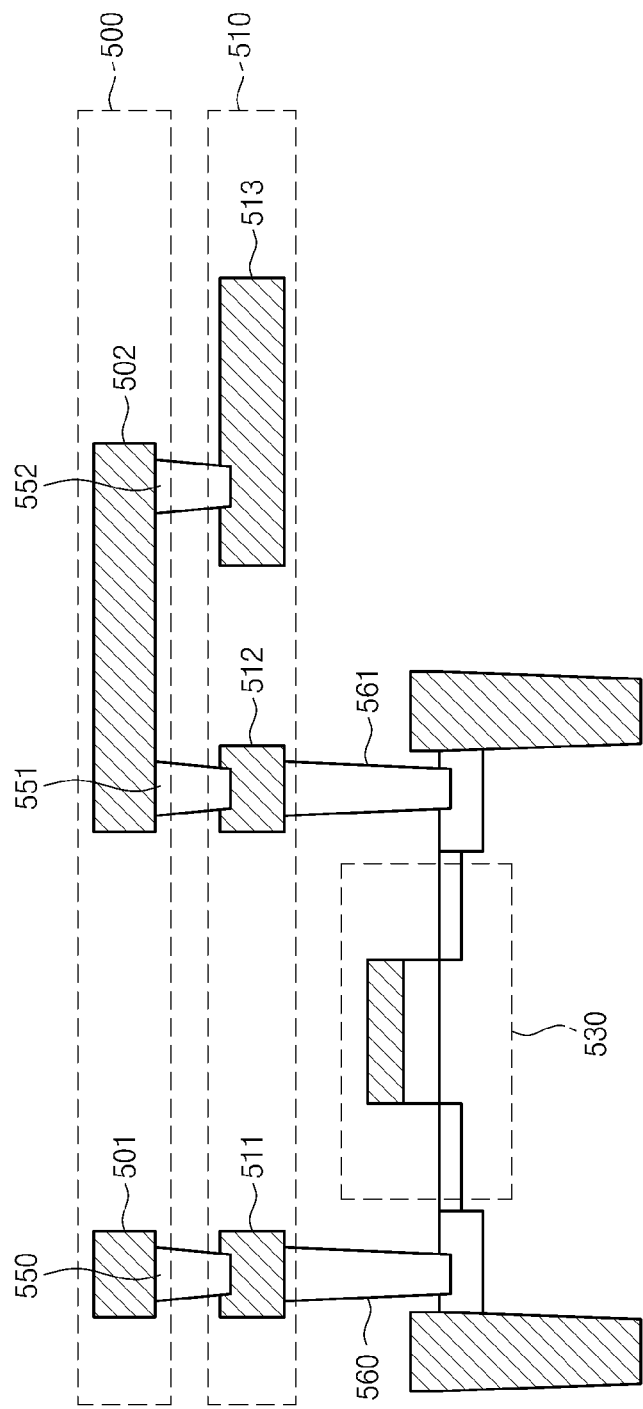
FIG. 10 is a sectional diagram showing cross-sections of A-A' of FIG. 4 and B-B' of FIG. 7, according to exemplary embodiments of the present invention.

FIG. 1 shows an array of a generic nonvolatile memory device 10. Referring to FIG. 10, the nonvolatile memory device 10 includes first and second memory fields 11a and 11b, first and second bit-line switch circuits 12a and 12b, and first and second latch circuits 13a and 13b. The first and second memory fields 11a and 11b are formed in a single well. The bit-line switch and latch circuits may be referred to as "page buffer."

The memory fields 11a and 11b include memory cells into which data are written by voltages provided through bit and word lines. A group of memory cells forms a page unit, in which the memory cells share a word line. Another group of memory cells forms a string unit, in which the memory cells are connected to a bit line in series. Multiple string units constitute a block, which is the unit for performing erasing operations.

The bit-line switch circuit 12 (including 12a and 12b) is configured to alternately select even-ordered bit lines BLe0, BLe1, ..., and odd-ordered bit lines BLo0, BLo1, ..., and to shield unselected bit lines. This bit-line arrangement may reduce current noises arising from a reading operation. Thus, reading data entirely from memory cells coupled to a single word line is accompanied with two selections for designating the even and odd-ordered bit lines by the bit-line switch circuit 12. These two switching operations are not restrictive to the reading operation. Even in a programming operation, data are input independently and programmed sequentially for even and odd-ordered pages. Each of switches SW1~SW8, for example, may be formed from a high voltage switch.

The first and second latch circuits 13a and 13b include multiple latches 1LAT0, 1LAT1, ..., and 2LAT0, 2LAT1, ..., respectively. Each of the latches 1LAT0, 1LAT1, ..., and 2LAT0, 2LAT1, is connected through the bit-line switch circuit 12a or 12b to one of the even and odd-ordered bit lines that form a bit-line pair. The first and second latch circuits 13a and 13b function as writing drivers in the programming operation, and as sense amplifiers in the reading operation. For example, during the programming operation, the first latch circuit 13a provides a pair of the even and odd-ordered bit lines sequentially with voltages corresponding to data to be programmed. While programming an MLC, the latch circuit 13a provides data of the LSB page to the bit lines, and afterward provides data of the MSB page. Accordingly, one latch is coupled to the two bit lines, i.e., a pair of the even and odd-ordered bit lines.

A control circuit 14 selects one of the odd and even-ordered bit lines in response to a column address and shields unselected bit lines. A decoder (not shown) controls connection between a bit line and a memory cell in response to a row address, providing a selected word line with a program or read voltage. In the programming operation, the decoder maintains connection between a selected memory cell and a bit line by providing a pass voltage to unselected word lines.

In the nonvolatile memory device 10 shown in FIG. 1, an even or odd-ordered bit line is selected by an address in the programming operation. Program disturbance occurs due to capacitive coupling between bit lines. Here, program disturbance refers to inadvertent programming caused by threshold voltage variation due to the capacitive coupling effect in an unselected memory cell. Such program disturbance is discussed, for example, in U.S. Pat. No. 5,867,429 to CHEN et al., entitled "High Density Non-Volatile Flash Memory without Adverse Effects of Electric Field Coupling Between Adjacent Floating Gates," the contents of which are hereby incorporated by reference. Such a programming scheme narrows a threshold voltage distribution of memory cells that has extended due to capacitive couplings.

Figure 2:
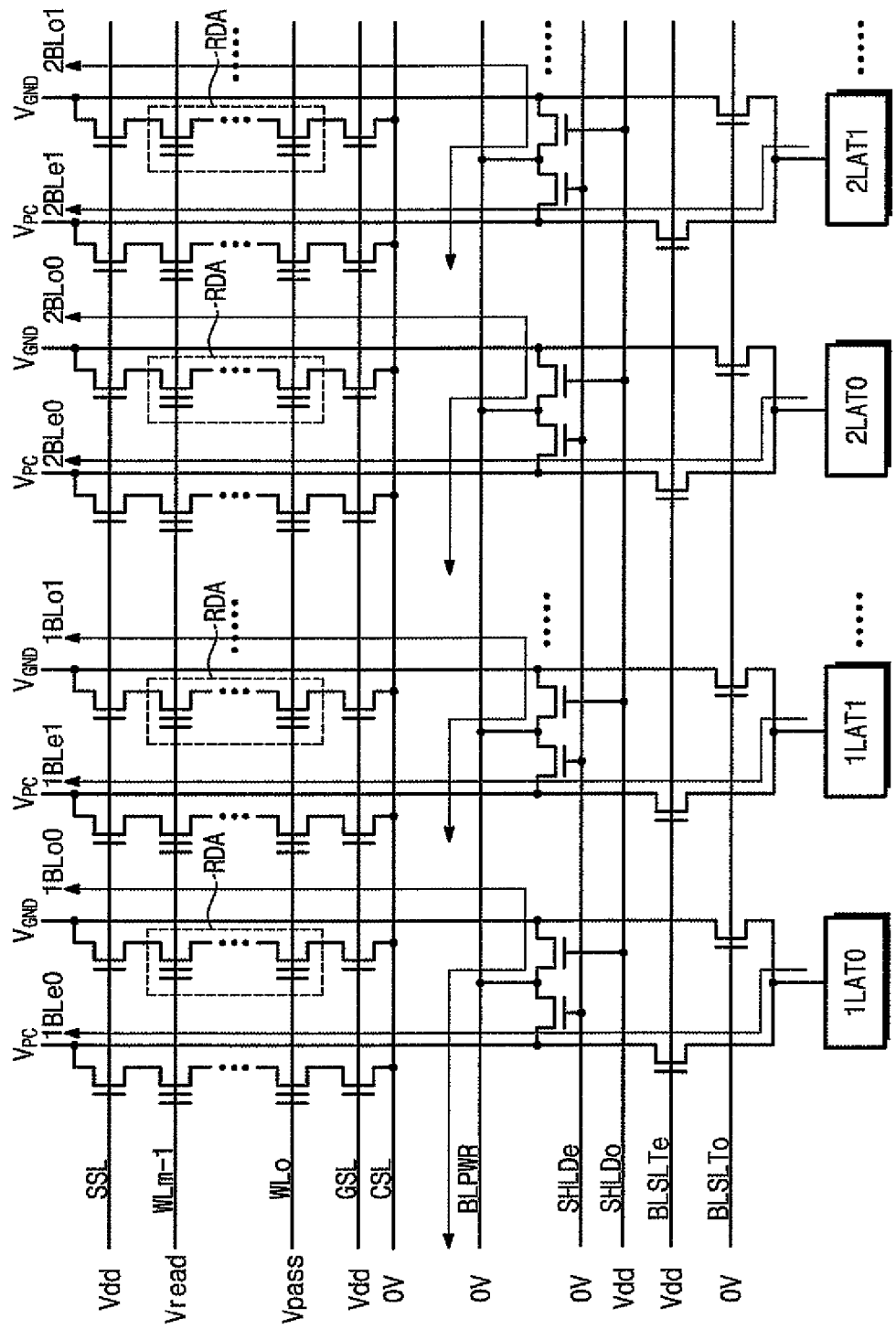
FIG. 2 is a circuit diagram showing voltage conditions of lines while reading out data from memory cells coupled to a word line of a first memory field.

FIG. 2 is a circuit diagram showing voltage conditions of lines while reading out data from memory cells coupled to a word line WLm-1 of the first memory field 11a, for example. Referring to FIG. 2, the first and second memory fields 11a and 11b are arranged to share bit-line selection lines BLSLTe and BLSLTo, shield lines SHLDe and SHLDo, and a bit-line power line BLPWR. Thus, the even-ordered bit lines 2BLe0, 2BLe1, ..., of the second memory field 11b are precharged at the same time as the even-ordered bit liens 1BLe0, 1BLe1, ..., of the first memory field 11a. Increased integration density could raise noise from a common source line CSL and a precharging voltage source of the second memory field 11b. Generally, increased noise deteriorates performance and characteristics of threshold voltage distribution in the nonvolatile memory device.

As shown in FIG. 2, memory cells weak in read disturbance are indicated by dashed line portions RDA. Read disturbance means that data "1" changes to data "0" during the reading operation. For strings connected to unselected bit lines, read/pass voltages are applied to selected/unselected word lines and the strings are grounded (e.g., to 0V) through the common source line CSL. Thus, as the worst case in the reading operation, memory cells, which are not to be programmed, may be easily programmed in the unselected string.

Figure 3:
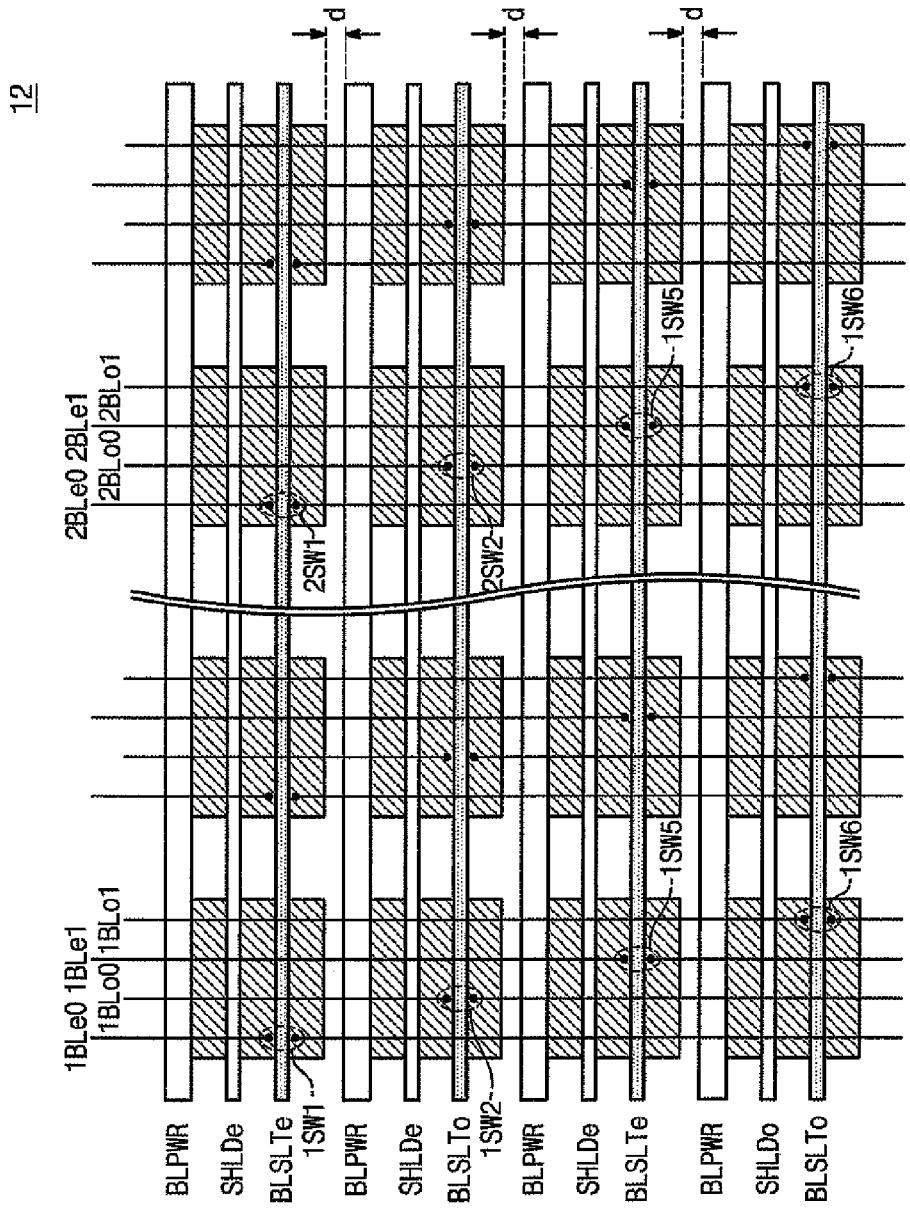
FIG. 3 is a layout showing a bit-line switch circuit of FIG. 1.

FIG. 3 is a layout showing an example of the bit-line switch circuit 12 of FIG. 1. Referring to FIG. 3, in the bit-line switch circuit 12, the switches 1SW1, 1SW2, ..., and 2SW1, 2SW2, ..., include active regions isolated from each other. As shown in FIG. 3, the active regions must be separated from the bit-line power line BLPWR by a predetermined interval d in order to maintain electrical isolation.

First Embodiment

A nonvolatile memory device according to a first exemplary embodiment of the present invention includes a memory cell array that has first and second page regions programmed in response to first and second addresses, respectively. The first and second page regions are coupled to the same word line. In particular, in the first and second page regions, memory cells connected to even and odd-ordered bit lines (hereinafter, "even-ordered" and "odd-ordered" will be referred to as "even" and "odd," respectively) are sequentially programmed during a programming operation. While precharging the even bit lines of the first page region during a reading/verifying operation, the odd bit lines of the first page region and all bit lines of the second page region are grounded. Accordingly, a level of a precharging voltage consumed during the reading/verifying operation is lowered in the nonvolatile memory device.

Figure 4:
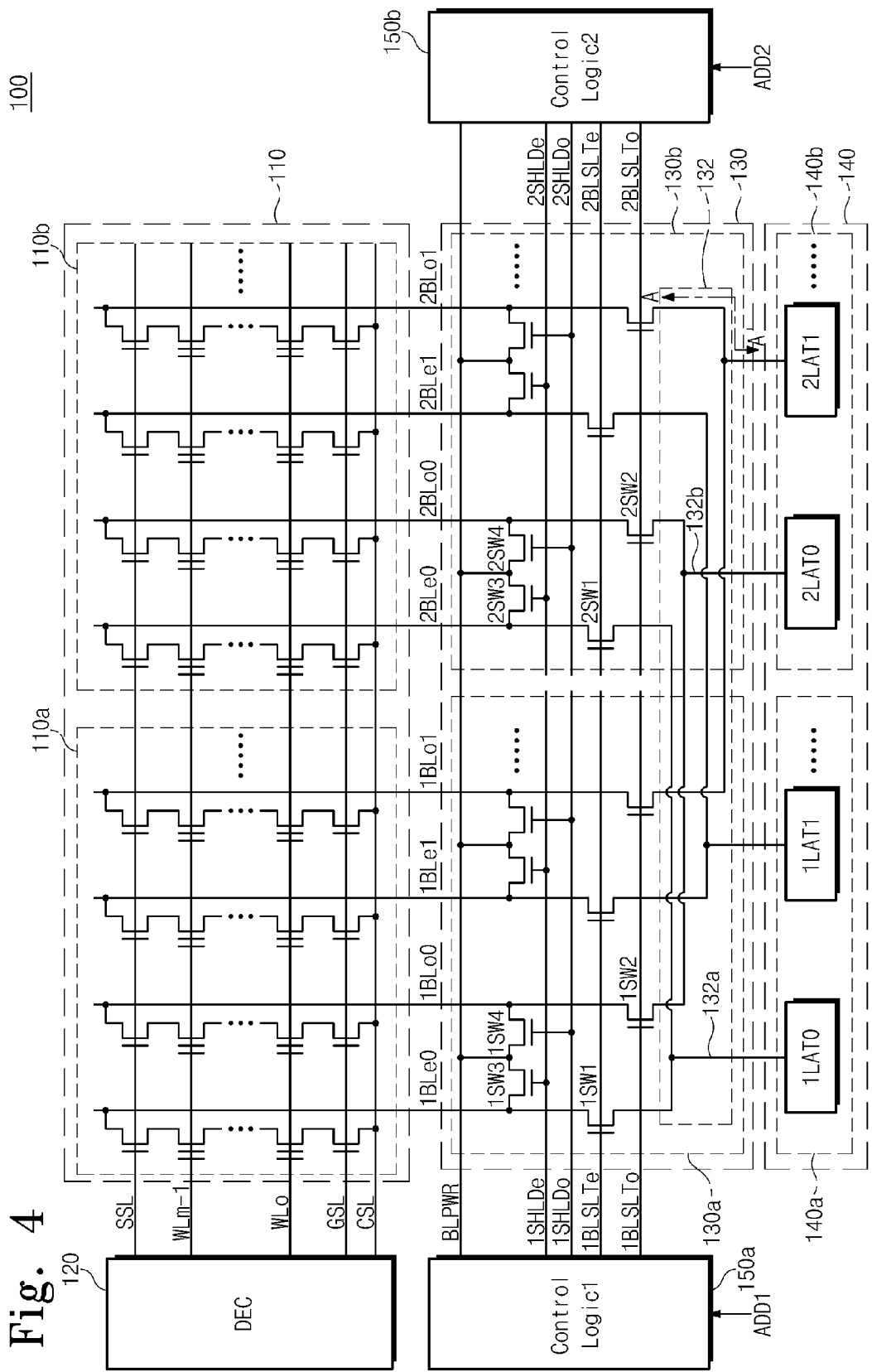
FIG. 4 is a circuit diagram showing a nonvolatile memory device, according to a first exemplary embodiment the present invention.

FIG. 4 is a circuit diagram showing a nonvolatile memory device, according to a first exemplary embodiment of the present invention. Referring to FIG. 4, nonvolatile memory device 100 includes a memory cell array 110, a decoder 120, a bit-line switch circuit 130, a latch circuit 140, and control circuits 150a and 150b. The memory cell array 110 includes memory cells arranged at intersections of multiple word lines (e.g., WL0~WLm-1) and multiple even and odd bit lines (e.g., 1BLe0, 1BLe1, . . . , 1BLo0, 1BLo1, . . . ).

The memory cell array 110 is divided into first and second page regions 110a and 110b. Each of the first and second page regions 110a and 110b includes adjacent memory cells coupled to each word line. The programming operation of the nonvolatile memory device 100 may be implemented to program the second page region 110b after programming the first page region 110a, for example. The nonvolatile memory device 100 shown in FIG. 4 is a NAND flash memory, but the present embodiment is not limited thereto. It will be apparent to one skilled in the art that the nonvolatile memory device according to the present embodiment may include other types of memories, such as a mask read-only memory (MROM), a phase-changeable random access memory (PRAM), a NOR-type flash memory, or the like.

The memory cell array 110 may be formed to have essentially the same structure and function as a generic cell array. The first and second page data are divisionally stored in the memory cells coupled to the same word line by the bit-line switch circuit 130 in the unit of adjacent memory cells. For example, the first page data loaded at the latch circuit 140 is stored in the first page region 110a in response to a first address ADD1 and the second page data loaded at the latch circuit 140 is stored in the second page region 110b in response to a second address ADD2. The first address ADD1 is different from the second address ADD2.

In the depicted embodiment, lines connected to a common source line CSL or dummy bit lines (not shown) are arranged between the first and second page regions 110a and 110b to isolate the regions from each other. Therefore, coupling effects between the two regions 110a and 110b are shielded.

While the memory cell array 110 shown in FIG. 4 is shown divided into the first and second page regions 110a and 110b, the present embodiment is not limited to this configuration. The first and second page regions 110a and 110b can be further segmented into multiple sectors by the dummy bit lines, for example. Divided page regions may be conductive in programming, reading and/or verifying operations in response to addresses independent from each other.

The bit-line switch circuit 130 includes a first bit-line switch circuit 130a for selecting bit lines 1BLe0, 1BLo0, 1BLe1, 1BLo1, . . . , which are electrically connected to the first page region 110a, and a second bit-line switch circuit 130b for selecting bit lines 2BLe0, 2BLo0, 2BLe1, 2BLo1, . . . , which are electrically connected to the second page region 110b. The first and second bit-line switch circuits 130a and 130b are controlled independently by the first and second control logic circuits 150a and 150b.

The bit-line switch circuit 130 provides signals to the bit lines corresponding to program data supplied from the latch circuit 140. The bit-line switch circuit 130 enables page data of the latch circuit 140 to be programmed into the first and second page regions 110a and 110b in compliance with independent controls by the first and second control logic circuits 150a and 150b.

The latch circuit 140 functions as a writing driver in the programming operation, and as a sense amplifier in the reading/verifying operation. The latch circuit 140 includes first latches 1LAT0, 1LAT1, . . . , each of which is shared by an even bit line of the first page region 110a and an even bit line of the second page region 110b, and second latches 2LAT0, 2LAT1, . . . , each of which is shared by an odd bit line of the first page region 110a and an odd bit line of the second page region 110b.

With the bit-line switch circuit 130, according to the present embodiment, coupling effects between memory cells coupled to the same word line may be interrupted by modifying interconnection patterns of the selection switches 1SW1, 1SW2, . . . , 2SW1, 2SW2, . . . . In other words, it is possible to completely shut off couplings between memory cells coupled to the same word line and storing the first and second page data in the memory cell array 110.

Meanwhile, interconnection lines 132 include a first interconnection line 132a connected to the first latch 1LAT0 of the first latch circuit 140a, and a second interconnection line 132b connected to the second latch 2LAT0 of the second latch circuit 140b.

The first selection switch 1SW1 of the first bit-line switch circuit 130a includes a source/drain connected to the first even bit line 1BLe0 of the first page region 110a, a drain/source connected to the first interconnection line 132a, and a gate connected to the first even bit-line selection line 1BLSLTe. The second selection switch 1SW2 of the first bit-line switch circuit 130a includes a source/drain connected to the first odd bit line 1BLo0 of the first page region 110a, a drain/source connected to the second interconnection line 132b, and a gate connected to the first odd bit-line selection line 1BLSLTo.

The first selection switch 2SW1 of the second bit-line switch circuit 130b includes a source/drain connected to the first even bit line 2BLe0 of the second page region 110b, a drain/source connected to the first interconnection line 132a, and a gate connected to the second even bit-line selection line 2BLSLTe. The second selection switch 2SW2 of the second bit-line switch circuit 130b includes a source/drain connected to the first odd bit line 2BLo0 of the second page region 110b, a drain/source connected to the second interconnection line 132b, and a gate connected to the second odd bit-line selection line 2BLSLTo.

The control logic circuit includes the first control logic circuit 150a for controlling the first bit-line switch circuit 130a, and the second control logic circuit 150b for controlling the second bit-line switch circuit 130b. In the depicted example, the first control logic circuit 150a is located to the left of the first bit-line switch circuit 130a and the second control logic circuit 150b is located to the right of the second bit-line switch circuit 130b.

The first control logic circuit 150a operates to control the first bit-line switch circuit 130a in response to a first address (e.g., ADD1). In particular, the first control logic circuit 150a, responding to the first address, generates a first shield signal for selecting the first even shield line 1SHLDe, a second shield signal for selecting the first odd shield line 1SHLDo, a first selection signal for selecting the first even bit-line selection line 1BLSLTe, and a second selection signal for selecting the first odd bit-line selection line 1BLSLTo. In an embodiment, the first control logic circuit 150a may also generate an isolation voltage to be supplied to a first bit-line isolation line 1BLISO (not shown). The isolation voltage may be equal to or less than a source-drain voltage of an isolation transistor, for example, discussed below.

The second control logic circuit 150b operates to control the second bit-line switch circuit 130b in response to the second address. In particular, the second control logic circuit 150b, responding to the second address, generates a third shield signal for selecting the second even shield line 2SHLDe, a fourth shield signal for selecting the second odd shield line 2SHLDo, a third selection signal for selecting the second even bit-line selection line 2BLSLTe, and a fourth selection signal for selecting the second odd bit-line selection line 2BLSLTo. In an embodiment, the second control logic circuit 150b may also generate an isolation voltage to be supplied to a second bit-line isolation line 2BLISO (not shown). The isolation voltage may be equal to or less than a source-drain voltage of an isolation transistor, for example, discussed below.

In the programming operation of the nonvolatile memory device 100, according to the exemplary embodiment, the second page region 110b is programmed after the first page region 110a. Referring to FIG. 4, the programming operation is carried out as follows.

First, to program page data in the first page region 110a, even data to be programmed in an even page of the first page region 110a are loaded into the first latch circuit 140a and odd data to be programmed in an odd page of the first page region 110a are loaded into the second latch circuit 140b. The even page includes memory cells connected to the even bit lines 1BLe0, 1BLe1, . . . , and the odd page includes the odd bit lines 1BLo0, 1BLo1, . . . . The first control logic circuit 150a enables the first even and odd bit-line selection lines 1BLSLTe and 1BLSLTo to be selected, and enables the first even and odd shield lines 1SHLDe and 1SHLDo to be unselected, in response to the first address ADD1. Meanwhile, the second control logic circuit 150b enables the second even and odd bit-line selection lines 2BLSLTe and 2BLSLTo to be selected, and enables the second even and odd shield lines 2SHLDe and 2SHLDo to be unselected, in response to the first address ADD1. Thereby, page data are programmed in the first page region 110a.

Then, to program page data the second page region 110b, even data to be programmed in an even page of the second page region 110b are loaded into the first latch circuit 140a and odd data to be programmed in an odd page of the second page region 110b are loaded into the second latch circuit 140b. The first control logic circuit 150a enables the first even and odd bit-line selection lines 1BLSLTe and 1BLSLTo to be selected, and enables the first even and odd shield lines 1SHLDe and 1SHLDo to be unselected, in response to the second address ADD2. Meanwhile, the second control logic circuit 150b enables the second even and odd bit-line selection lines 2BLSLTe and 2BLSLTo to be selected, and enables the second even and odd shield lines 2SHLDe and 2SHLDo to be unselected, in response to the second address ADD2. Thereby, page data are programmed in the second page region 110b.

Figure 5:
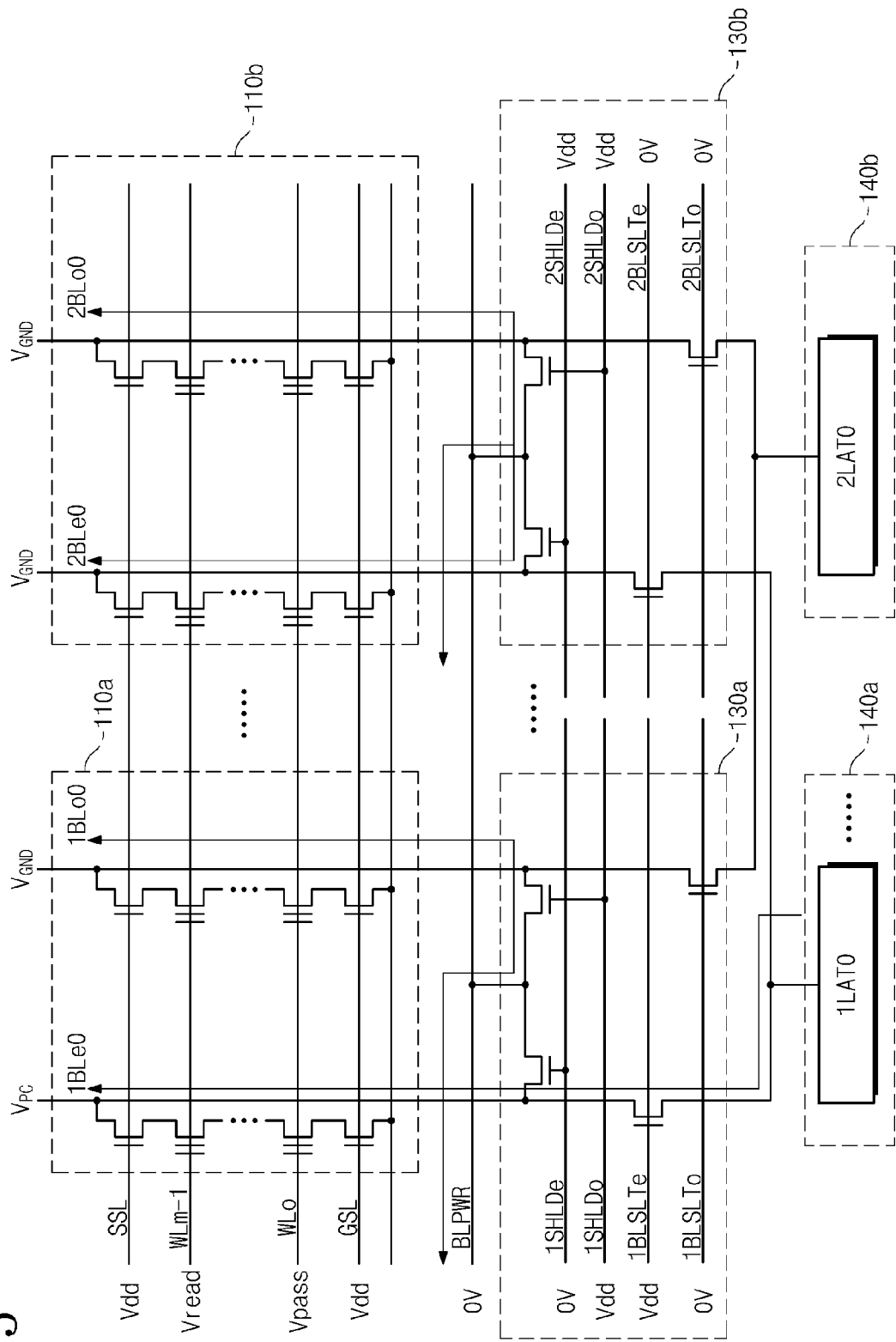
FIG. 5 is a circuit diagram showing voltage conditions during a reading/verifying operation in a nonvolatile memory device, according to a first exemplary embodiment of the present invention.

In the reading/verifying operation of the nonvolatile memory device 100, according to the exemplary embodiment, the second page region 110b is read after the first page region 110a. FIG. 5 shows voltage conditions during the reading/verifying operation in the nonvolatile memory device according to the present embodiment. Referring to FIGS. 4 and 5, the reading operation is carried out as follows. The voltage conditions set while reading data from an even page coupled to a selected word line (e.g., WLm-1) of the first page region are shown in FIG. 5 for purposes of discussion.

In the memory cell array 110, a read voltage is applied to the selected word line (e.g., WLm-1) designated by the first address, and a pass voltage is applied to unselected word lines WL0 WLm-2. The power source voltage Vdd is applied to string and ground selection lines SSL and GSL. A bit-line power line BLPWR is set to ground voltage (e.g., 0V).

In the first bit-line switch circuit 130a, 0V is applied to the first even shield line 1SHLDe to turn off the switch 1SW3 and the power source voltage Vdd is applied to the first odd shield line 2SHLDo to turn on the switch 1SW4. The power source voltage Vdd is applied to the first even bit-line selection line 1BLSLTe to turn on the switch 1SW1, and 0V is applied to the first odd bit-line selection line 1BLSLTo to turn off the switch 1SW2. Thereby, in the first page region 110a, the even bit lines 1BLe0, 1BLe1, . . . , are precharged, while the odd bit lines 1BLo0, 1BLo1, . . . , are grounded.

In the second bit-line switch circuit 130b, the power source voltage Vdd is applied to the second even and odd shield lines 2SHLDe and 2SHLDo to turn on the switches 2SW3 and 2SW4, and 0V is applied to the second even and odd bit-line selection lines 2BLSLTe and 2BLSLTo to turn off the switches 2SW1 and 2SW2. Thereby, all bit lines 2BLe0, 2BLo0, 2BLe1, 2BLo1, . . . , are grounded.

Consequently, as illustrated in FIG. 5, only the even bit lines 1BLe0, 1BLe1, . . . , of the first page region 110a are precharged (e.g., set on a first precharging voltage Vpc), while the odd bit lines 1BLo0, 1BLo1, . . . , of the first page region 110a and all of the bit lines 2BLe0, 2BLo0, 2BLe1, . . . , of the second page region 110b are grounded (e.g., 0V or $V_{GND}$). Therefore, the nonvolatile memory device 100 according to the depicted exemplary embodiment lowers a precharging voltage, relative to conventional nonvolatile memory devices, and is thus able to reduce coupling capacitance between adjacent bit lines.

Figure 6:
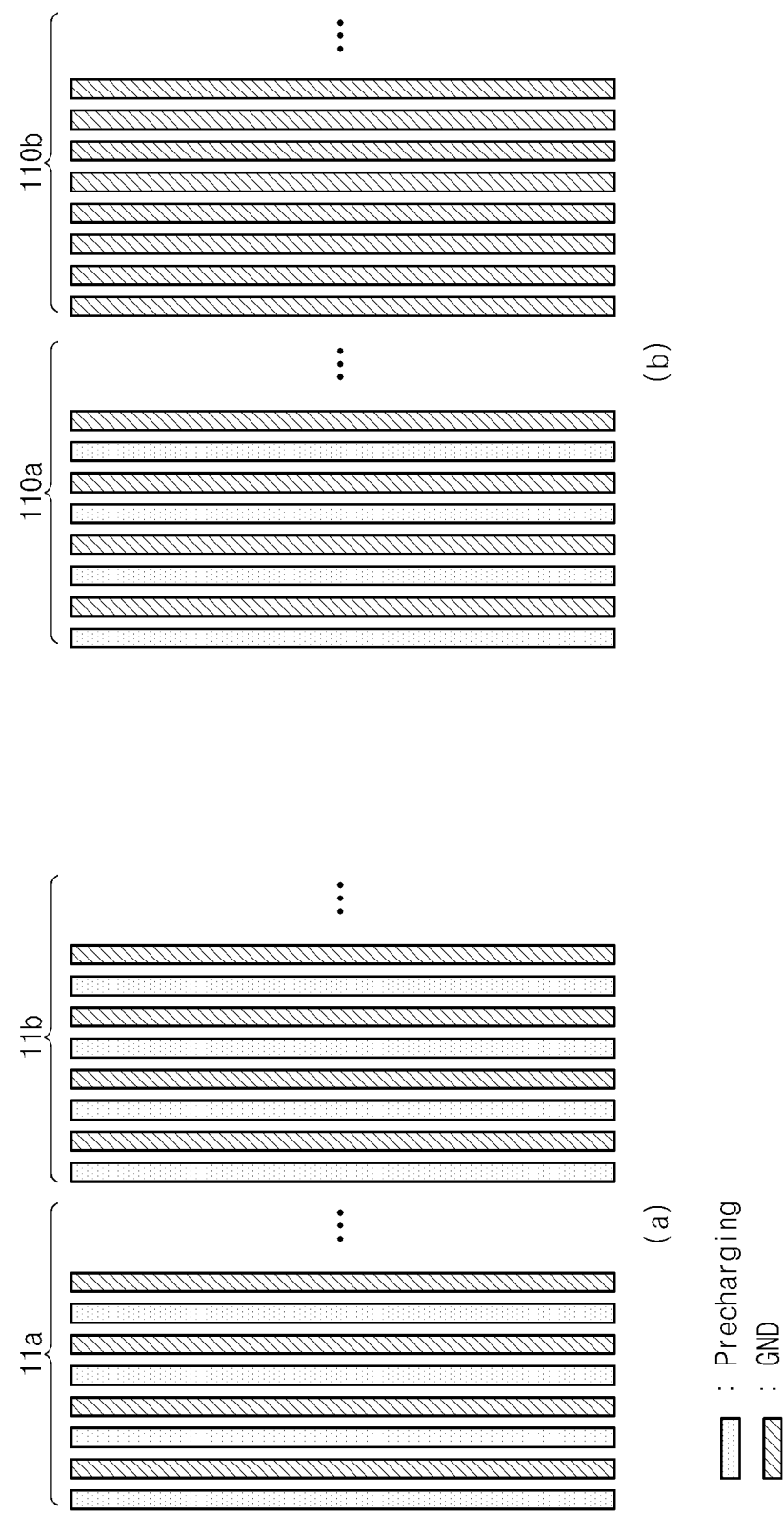
FIGS. 6(a) and 6(b) is a comparison showing bit-line selection states of nonvolatile memory devices.

FIGS. 6(a) and 6(b) comparatively show bit-line selection states of the nonvolatile memory device of the present embodiment and a conventional nonvolatile memory device. FIG. 6(a) illustrates a precharged state of bit lines in a conventional nonvolatile memory device during a reading/verifying operation. Referring to FIG. 6(a), all of even bit lines belonging to the first and second memory fields 11a and 11b are precharged, while the reading/verifying operation is processed for even page data of the first memory field 11a.

In comparison, referring to FIG. 6(b), the nonvolatile memory device according to the present exemplary embodiment only requires precharging the even bit lines of the first page region 110a, while the reading/verifying operation is processed for even page data of the first memory field 110a. Accordingly, power consumption and noise is reduced, while integration density may be increased. Thus, threshold voltage distribution and drivability characteristics are improved for the nonvolatile memory device.

In the bit-line switch circuit 130 shown in FIG. 4, the selection switches 1SW1, 1SW2, 2SW1, and 2SW2 may include active regions field-isolated from each other. However, the embodiment is not limited to this configuration.

Second Embodiment

Figure 7:
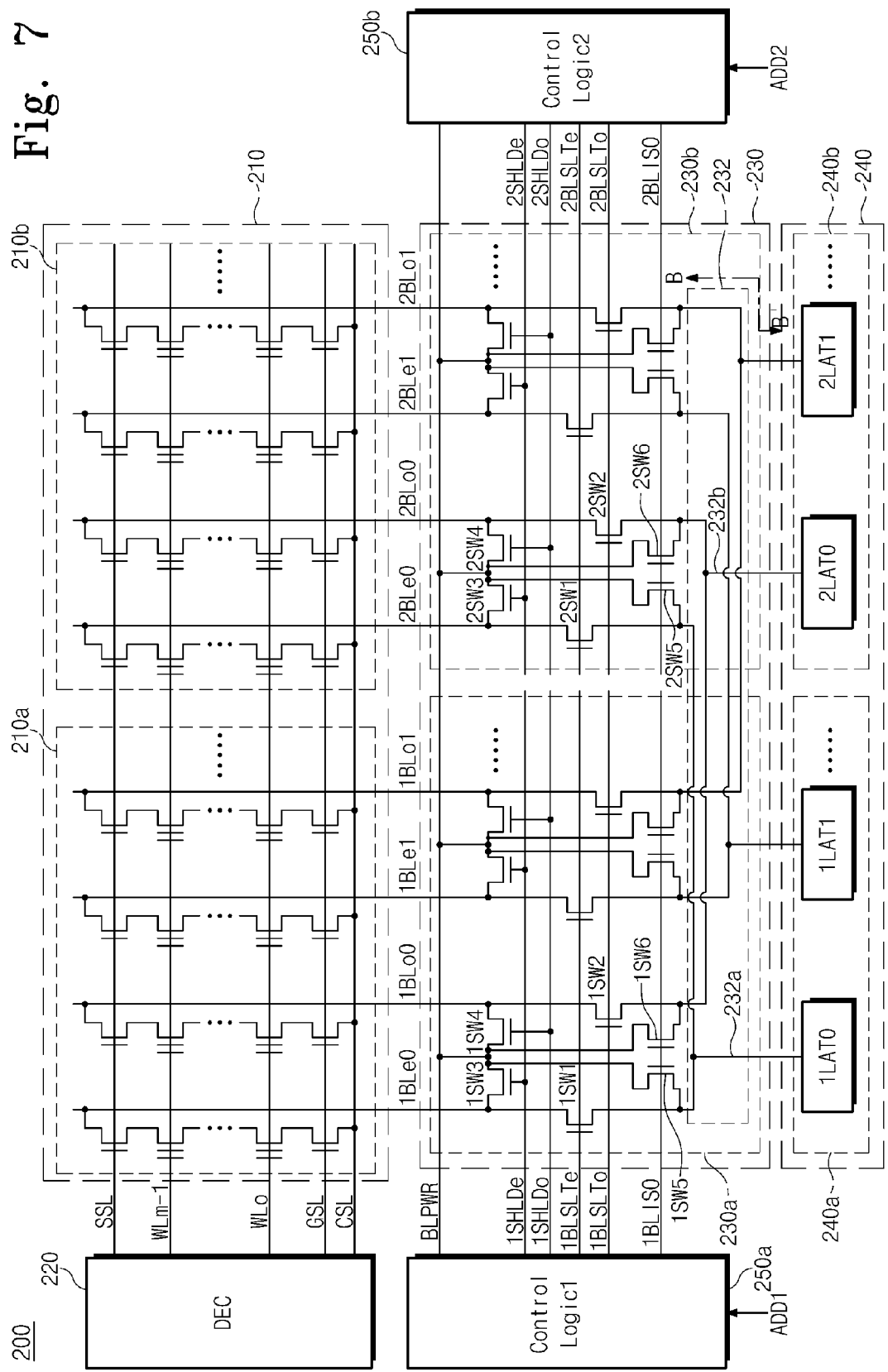
FIG. 7 is a circuit diagram showing a nonvolatile memory device, according to a second exemplary embodiment of the present invention.

FIG. 7 is a circuit diagram showing a nonvolatile memory device, according to a second exemplary embodiment of the present invention. Referring to FIG. 7, nonvolatile memory device 200 additionally includes isolation transistors 1SW5, 1SW6, 2SW5, and 2SW6 connected between the bit-line power line BLPWR and the bit lines, respectively. The isolation transistors 1SW5, 1SW6, 2SW5, and 2SW6 operate in response to an isolation voltage supplied through bit-line isolation lines 1BLISO and 2BLISO. The isolation transistors 1SW5, 1SW6, 2SW5, and 2SW6 may take the place of field isolation spaces. The isolation transistors 1SW5, 1SW6, 2SW5, and 2SW6 may be made up with high-voltage transistors, for example.

The isolation voltage may be set to be equal to or less than a source-drain voltage of the isolation transistor, maintaining the isolation transistors 1SW5, 1SW6, 2SW5, and 2SW6 normally in a turned-on state.

By adopting the isolation transistors 1SW5, 1SW6, 2SW5, and 2SW6 in a bit-line switch circuit 230 (including first bit-line switch circuit 230a and second bit-line switch circuit 230b) of the nonvolatile memory device 200, there is no need to provide the field isolation spaces between the active regions of the switch transistors. In particular, the selection switches 1SW1 and 1SW2 of the first bit-line switch circuit 230a may be formed in a first active region (not shown) and the selection switches 2SW1 and 2SW2 of the second bit-line switch circuit 230b may be formed in a second active region (not shown). This configuration enables reduction of a layout size of the bit-line switch circuit 230, for example, as shown in conjunction with FIG. 8.

Meanwhile, the nonvolatile memory device 200, according to the depicted exemplary embodiment, may be configured to provide the power source voltage Vdd, not the ground voltage, to the lines 1SHLDe, 1SHLDo, 1BLSLTe, 1BLSLTo, 1BLISO, 2SHLDe, 2SHLDo, 2BLSLTe, 2BLSLTo, and 2BLISO coupled to gates of the isolation transistors. This prevents degradation of isolation characteristics on the isolation switches or transistors 1SW5, 1SW6, 2SW5, and 2SW6 due to gate-included drain leakage in an erasing operation.

Figure 8:
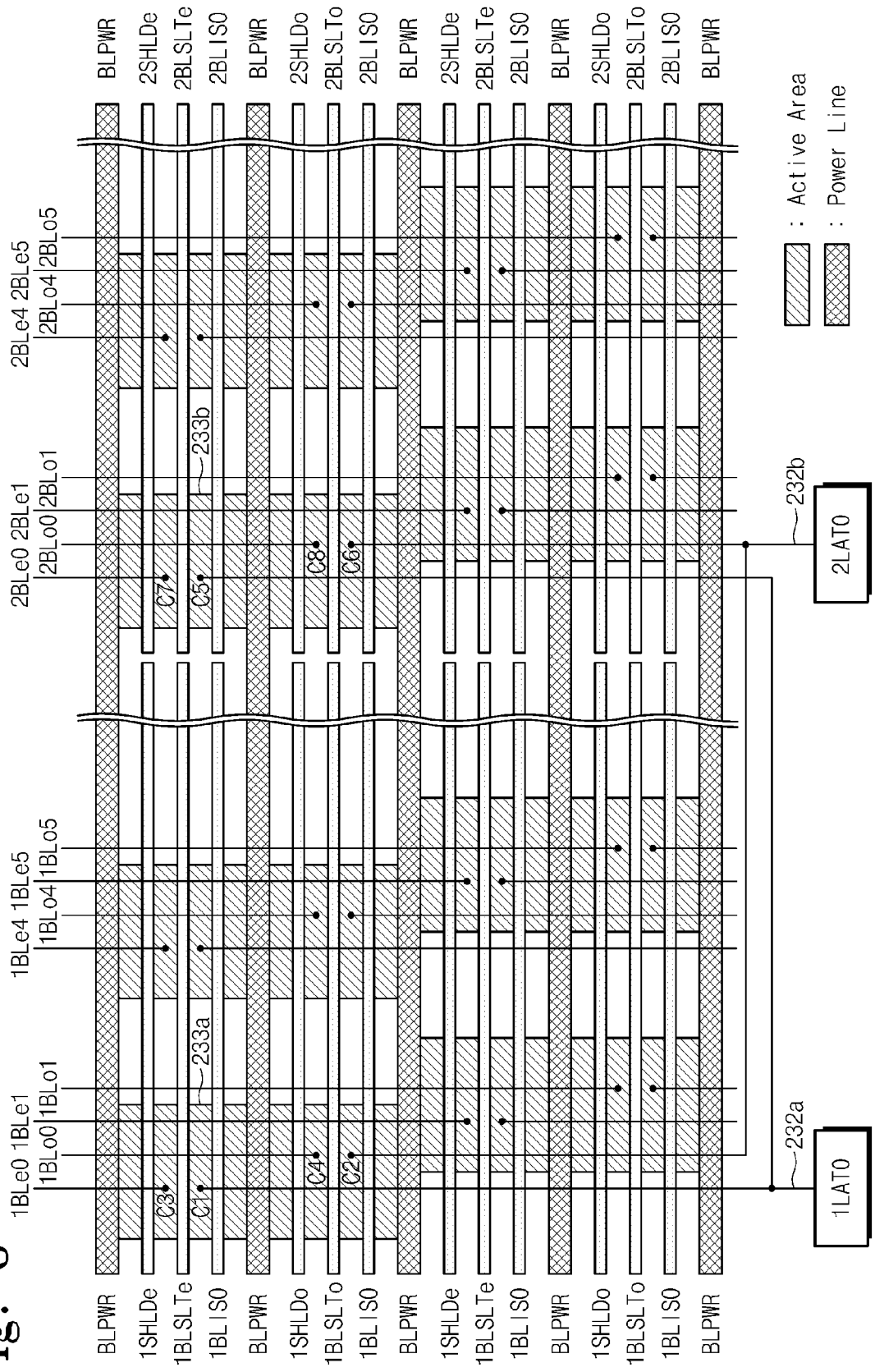
FIG. 8 is a layout showing a bit-line switch circuit of FIG. 7.

FIG. 8 is a layout showing the bit-line switch circuit 230 of FIG. 7. Referring to FIGS. 7 and 8, the field isolation spaces are not included in the areas between the active regions of the switch transistors. Each active region is associated with a pair of the selection transistors 1SW1 and 1SW2.

The first bit-line isolation line 1BLISO is connected to gates of the isolation transistors 1SW5 and 1SW6. A first control logic circuit 250a supplies the isolation voltage to the first bit-line isolation line 1BLISO to maintain the isolation transistors 1SW5 and 1SW6 in the turned-off state. The level of the isolation voltage may be equal to or less than a source-drain voltage of the isolation transistors 1SW5 and 1SW6, for example.

Meanwhile, the second bit-line isolation line 2BLISO is connected to gates of the isolation transistors 2SW5 and 2SW6. A second control logic circuit 250b supplies the isolation voltage to the second bit-line isolation line 2BLISO to maintain the isolation transistors 2SW5 and 2SW6 in the turned-off state. The level of the isolation voltage may be equal to or less than a source-drain voltage of the isolation transistors 2SW5 and 2SW6, for example.

In the nonvolatile memory device 200 according to the present embodiment, the first and second control logic circuits 250a and 250b are configured to provide an adequate level of the isolation voltage to the first and second bit-line isolation lines 1BLISO and 2BLISO, holding the isolation transistors 1SW5, 1SW6, 2SW5, and 2SW6 in turned-off states during a normal operation.

The first bit-line switch circuit 230a includes first even bit-line selection lines 1BLSLTe through which a first selection signal is transferred, first odd bit-line selection lines 1BLSLTo through which a second selection signal is transferred, and the first bit-line isolation line 1BLSO. The first even and odd bit-line selection lines 1BLSLTe and 1BLSLTo may be alternately arranged to each other in the first bit-line switch circuit 230a.

The second bit-line switch circuit 230b includes second even bit-line selection lines 2BLSLTe through which a third selection signal is transferred, second odd bit-line selection lines 2BLSLTo through which a fourth selection signal is transferred, and the second bit-line isolation line 2BLSO. The second even and odd bit-line selection lines 2BLSLTe and 2BLSLTo may be alternately arranged to each other in the second bit-line switch circuit 230b.

The bit-line switch circuit 230 further includes an interconnection region 232 that includes a first interconnection line 232a leading from the first latch 1LAT0 of the first latch circuit 240a, and a second interconnection line 232b leading from the second latch 2LAT0 of the second latch circuit 240b.

As illustrated in FIG. 8, in a first active region 233a, the first interconnection line 232a is connected to a first contact C1, the second interconnection line 232b is connected to a second contact C2, an even bit-line 1BLe0 of a first page region 210a is connected to a third contact C3, and an odd bit-line 1BLo0 of the first page region 210a is connected to a fourth contact C4. In a second active region 233b, the first interconnection line 232a is connected to a fifth contact C5, the second interconnection line 232b is connected to a sixth contact C6, an even bit-line 2BLe0 of a second page region 210b is connected to a seventh contact C7, and an odd bit-line 2BLo0 of the second page region 210b is connected to an eighth contact C8.

The first even bit-line selection line 1BLSLTe is between the first and third contacts C1 and C3 in an upper portion or top of the first active region 233a, and the first odd bit-line selection line 1BLSLTo is between the second and fourth contacts C2 and C4 in a lower portion or bottom of the first active region 233a. The second even bit-line selection line 2BLSLTe is between the fifth and seventh contacts C5 and C7 in an upper portion or top of the second active region 233b, and the second odd bit-line selection line 2BLSLTo is between the sixth and eighth contacts C6 and C8 in a lower portion of bottom of the second active region 233b.

Other layers different from the bit lines may be formed between the first interconnection line 232a and the first and fifth contacts C1 and C5, and between the second interconnection line 232b and the second and sixth contacts C2 and C6, including metal lines intersecting the bit lines, for example. This arrangement will be discussed in more detail in conjunction with FIG. 10.

The bit-line power line BLPWR is arranged to be shared by the first and second bit-line switch circuits 230a and 230b. Although not shown, contacts may be located on the tops of shield lines 1SHLDe, 1SHLDo, 2SHLDe, and 2SHLDo. These contacts are connected to the bit-line power line BLPWR. A shielding signal supplied to the shield lines 1SHLDe, 1SHLDo, 2SHLDe, and 2SHLDo determines electrical connections between the bit-line power line BLPWR and the bit lines.

In the nonvolatile memory device shown in FIG. 3, for example, the bit-line selection lines are respectively provided in the active regions, which need to have intervening isolation spaces. In contrast, in the nonvolatile memory device 200 shown in FIG. 8, the bit-line selection switches or transistors 1SW1 and 1SW2, for example, are located in a single active region, and are isolated from one another by the isolation transistors 1SW5 and 1SW6. Thus, it is unnecessary for the nonvolatile memory device 200 of FIG. 8 to include the field isolation spaces. As a result, the nonvolatile memory device 200 according to the present exemplary embodiment is able to scale down layout size of the bit-line switch circuit 230.

FIGS. 9(a) and 9(b) comparatively show layout sizes of bit-line switch circuits in the nonvolatile memory device of the present embodiment and a conventional nonvolatile memory device. FIG. 9(a) shows a microscopic layout of a generic bit-line switch circuit, and FIG. 9(b) shows a microscopic layout of the bit-line switch circuit according to the present embodiment. Referring to FIGS. 9(a) and 9(b), the bit-line switch circuit of FIG. 9(a) measures 215 μm and the bit-line switch circuit of FIG. 9(b) measures 178 μm. Thus, the bit-line switch circuit of the nonvolatile memory device 200, according to the exemplary embodiment of the present invention, is scaled down by more than 17%.

FIG. 10 is a sectional diagram showing cross-sections A-A' of FIG. 4 and B-B' of FIG. 7, for example. FIG. 10 shows a selection switch or transistor 530, metal layers 500 and 510 for connecting source and drain of the selection switch 530, and contact plugs 550, 551, 552, 560 and 561. Metal lines 511, 512 and 513 connect the selection switch 530 to other selection switches (not shown in FIG. 10), and are shown to be implemented by the metal layer 510. The metal layer 500 may be used for the bit lines, for example.

As illustrated in FIG. 10, the source and drain of the selection switch 530 are connected to the metal layer 500 by way of the contact plugs 550/560 and 551/561, respectively. A metal line 502, which is formed at an end of the selection switch 530 by a conductive metal line 502 placed on the same level, extends toward the latch circuit 140 (e.g., refer to FIG. 4). The metal line 502 is connected to the metal line 513, which extends toward the word line, through the contact plug 552. The metal line 513 is connected to another selection switch, for example, which is located at another side of the same structure. However, the metal line 513 may be formed on a metal layer other than the metal layer 510.

According to the bit-line selection architecture including the metal line 513, capacitive couplings between the memory cells may be interrupted just by forming interconnections between the selection switches without structural modifications of other relative circuits.

In the nonvolatile memory devices shown in FIGS. 4 and 7, the even and odd bit lines are alternately selected in the reading/verifying operation. In other words, during the reading/verifying operation of the first page region, an odd page region connected to the odd bit lines is sensed after an even page connected to the even bit lines. For the second page region, the reading/verifying operation is carried out in the same manner. However, the present embodiment is not limited to this implementation. For instance, the reading/verifying operation may be implemented by the first and second page data being read together, without discriminating even and odd in order.

Third Embodiment

Figure 11:
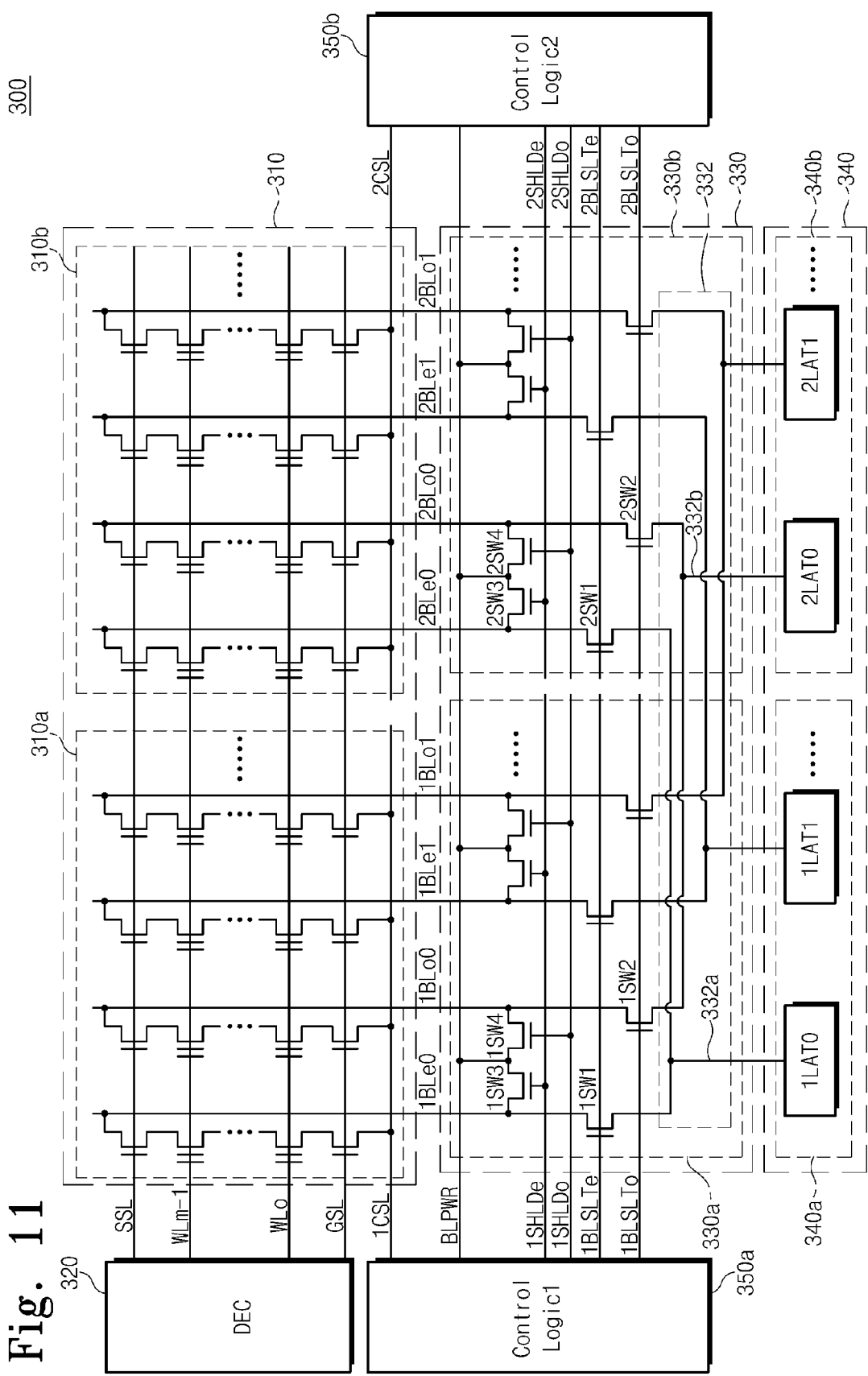
FIG. 11 is a circuit diagram showing a nonvolatile memory device, according to a third exemplary embodiment of the present invention.

FIG. 11 is a circuit diagram showing a nonvolatile memory device, according to a third exemplary embodiment of the present invention. Referring to FIG. 11, in nonvolatile memory device 300, common source lines 1CSL and 2CSL are divisionally assigned to respective page regions 310a and 310b of a memory cell array 310, and through which the memory cells of the page regions 310a and 310b may be respectively grounded. Control logic circuits 350a and 350b operate to control the first and second common source line 1CSL and 2CSL, respectively. The memory cell array 310 shown in FIG. 11 is configured to include the two page regions 310a and 310b. However, the present exemplary embodiment is not limited to this configuration, such that the memory cell array 310 may include more than two page regions. In particular, pages may be arranged corresponding to a single word line and independently designated by addresses different from each other. Notably, throughout the various embodiments (including the present embodiment) described herein, the respective memory cell arrays are simply illustrated as including two page regions for convenience of description.

In addition, the nonvolatile memory device 300 of the present embodiment is configured to sequentially sense the first and second page data together (e.g., in a lump), without discriminating even and odd in order. Here, the first page data corresponds to the first page region 310a and the second page data corresponds to the second page region 310b. The first and second page regions 310a and 310b may be formed in a single well, for example.

In more detail, during the reading/verifying operation for the first page region 310a, first even and odd bit lines 1BLe0, 1BLe1, . . . , 1BLo0, 1BLo1, . . . , are selected at the same time. In the reading/verifying operation for the second page region 310b, second even and odd bit lines 2BLe0, 2BLe 1, . . . , 2BLo0, 2BLo1, . . . , are also selected at the same time.

During the reading/verifying operation, bit lines of the unselected page region are floated or supplied with a predetermined voltage (e.g., a second precharging voltage) Vpc', without being connected to the ground voltage. This is for the purpose of lessening read disturbance which would be caused by the unselected page region. The reason for reducing read disturbance in the nonvolatile memory device 300 will be discussed in more detail below with respect to FIG. 12.

However, in alternative implementations, the bit lines of the unselected page region may be normally grounded. For example, as described with reference to FIG. 4, for reducing power consumption, the ground voltage may be supplied to bit lines of the unselected page region in the nonvolatile memory device 300, according to the present exemplary embodiment.

In the nonvolatile memory device 300, the common source lines 1CSL and 2CSL are independently controlled with respect to the page regions 310a and 310b. A bit-line switch circuit 330 and a latch circuit 340 shown in FIG. 11 may be designed in various configurations. For example, the latch circuit 340 can be configured such that all of the bit lines, 1BLe0, 1BLo0, 1BLe1, 1BLo1, . . . , 2BLe0, 2BLo0, 2BLe1, 2BLo1, . . . , correspond to respective latches.

Figure 12:
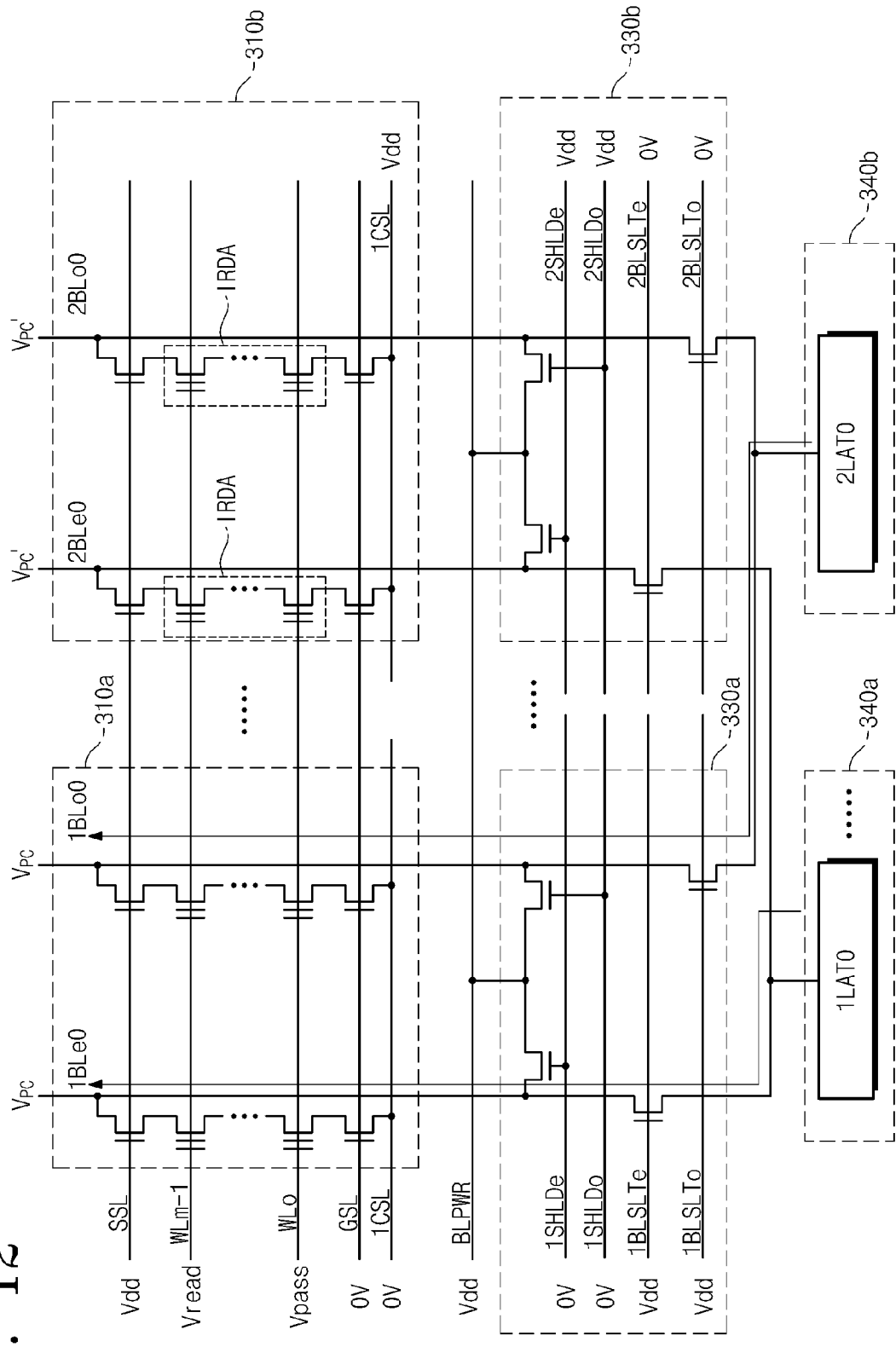
FIG. 12 is a circuit diagram showing voltage conditions during a reading/verifying operation in the nonvolatile memory device of FIG. 11.

FIG. 12 is a circuit diagram showing voltage conditions during the reading/verifying operation of the nonvolatile memory device of FIG. 11. Referring to FIG. 12, voltages are supplied to the first page region 310a in order to read data from memory cells coupled to a selected word line (e.g., WLm-1).

In the memory cell array 310, the read voltage Vread is applied to the selected word line WLm-1 designated by the first address ADD1, while the pass voltage Vpass is applied to the unselected word lines WL0~WLm-2. The power source voltage Vdd is applied to the string and ground selection lines SSL and GSL. Also, 0V is applied to the first common source line 1CSL, while the power source voltage Vdd is applied to the second common source line 2CSL. The power source voltage Vdd, or the second precharging voltage Vpc', may be supplied to the bit-line power line BLPWR.

In the first bit-line switch circuit 330a, 0V is applied to the even and odd shield lines 1SHLDe and 1SHLDo to turn off the switches 1SW3 and 1SW4. The power source voltage Vdd is applied to the even bit-line selection line 1BLSLTe to turn on the switch 1SW1. The power source voltage Vdd is applied to the odd bit-line selection line 1BLSLTo to turn on the switch 1SW2. Then, the even bit lines 1BLe0, 1BLe1, . . . , of the first page region 310a are set to the first precharging voltage Vpc and the odd bit lines 1BLo0, 1BLo1, . . . , of the first page region 310a are set to the first precharging voltage Vpc.

In the second bit-line switch circuit 330b, the power source voltage Vdd is applied to the even and odd shield lines 2SHLDe and 2SHLDo to turn on the switches 2SW3 and 2SW4. Also, 0V is applied to the even and odd bit-line selection lines 2BLSLTe and 2BLSLTo to turn off the switches 2SW1 and 2SW2. Then, all of the bit lines 2BLe0, 2BLo0, 2BLe1, 2BLo1 . . . , of the second page region 310b are set to the second precharging voltage Vpc'.

Figure 13:
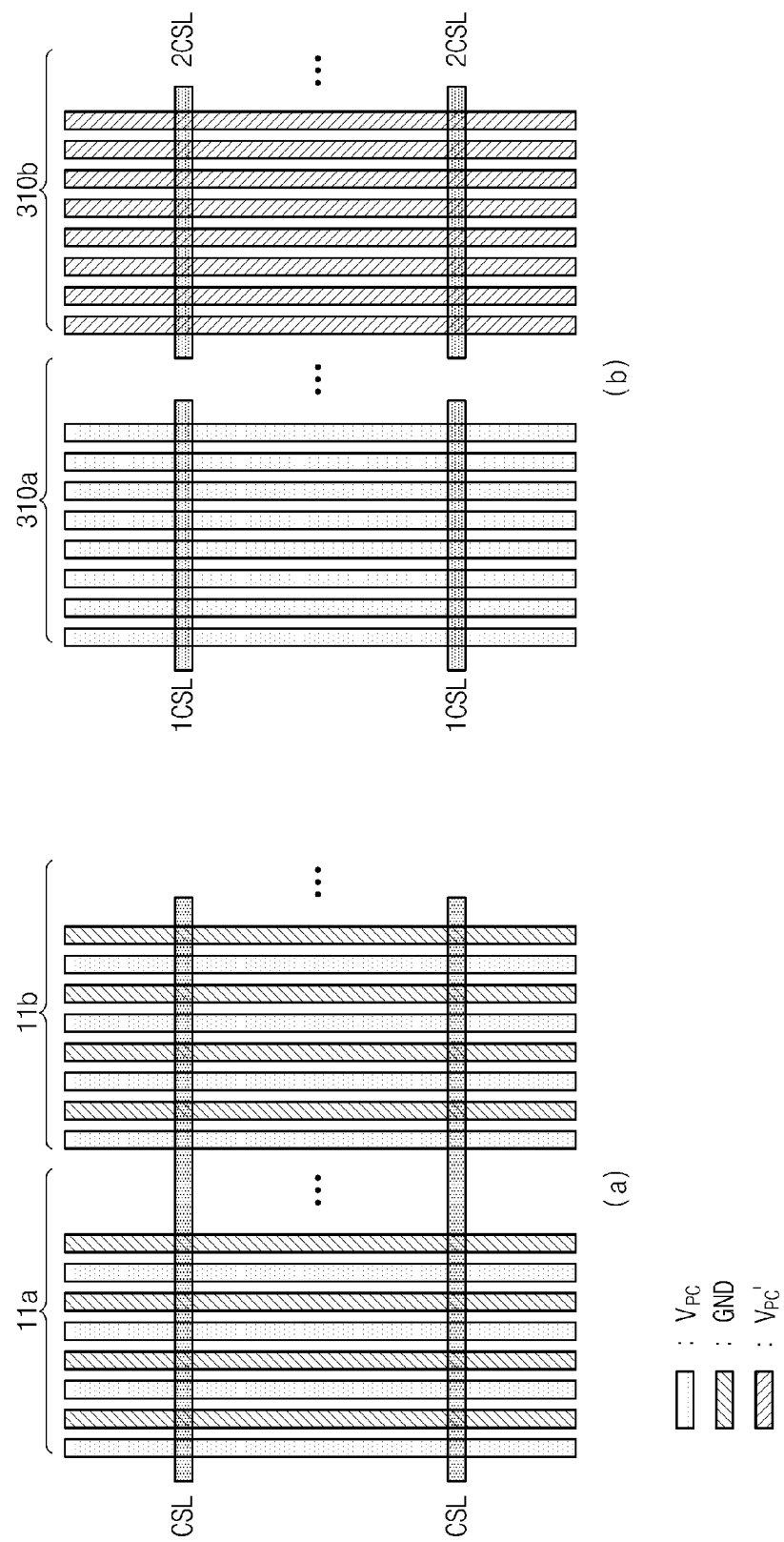
FIGS. 13(a) and 13(b) is a comparison showing bit-line selection states of nonvolatile memory devices.

FIGS. 13(a) and 13(b) comparatively show bit-line selection states of the nonvolatile memory device of the present embodiment and a conventional nonvolatile memory device. Referring to FIGS. 12, 13(a) and 13(b), all of the bit lines 1BLe0, 1BLo0, 1BLe1, 1BLo1, . . . , of the first page region 310a are set at the first precharging voltage Vpc, while all of the bit lines 2BLe0, 2BLo0, 2BLe2, 2BLo1, . . . , of the second page region 310b are set at the second precharging voltage Vpc'.

In the nonvolatile memory device 300, according to the present exemplary embodiment, during the reading/verifying operation, the unselected bit lines 2BLe0, 2BLo0, 2BLe1, 2BLo1, . . . , are precharged to the second precharging voltage Vpc' and the common source line 2CSL of the unselected page region 310b is supplied with a predetermined voltage (e.g., the power source voltage Vdd). Thus, the selection switches connected each to the unselected bit lines 2BLe0, 2BLo0, 2BLe21, 2BLo1, . . . , are shut off during the reading/verifying operation. Accordingly, channels connected to the unselected bit lines 2BLe0, 2BLo0, 2BLe1, 2BLo1, . . . , are floated to induce self-boosting effects in the reading/verifying operation. As a result, memory cells of the second page region 310b, which are connected to the connected to the unselected bit lines 2BLe0, 2BLo0, 2BLe1, 2BLo1, . . . , are prevented from being programmed inadvertently, reducing read disturbance during the reading/verifying operation. Accordingly, the nonvolatile memory device 300 reduces read disturbance during the reading/verifying operation by independently controlling the common source lines by page regions.

Fourth Embodiment

Figure 14:
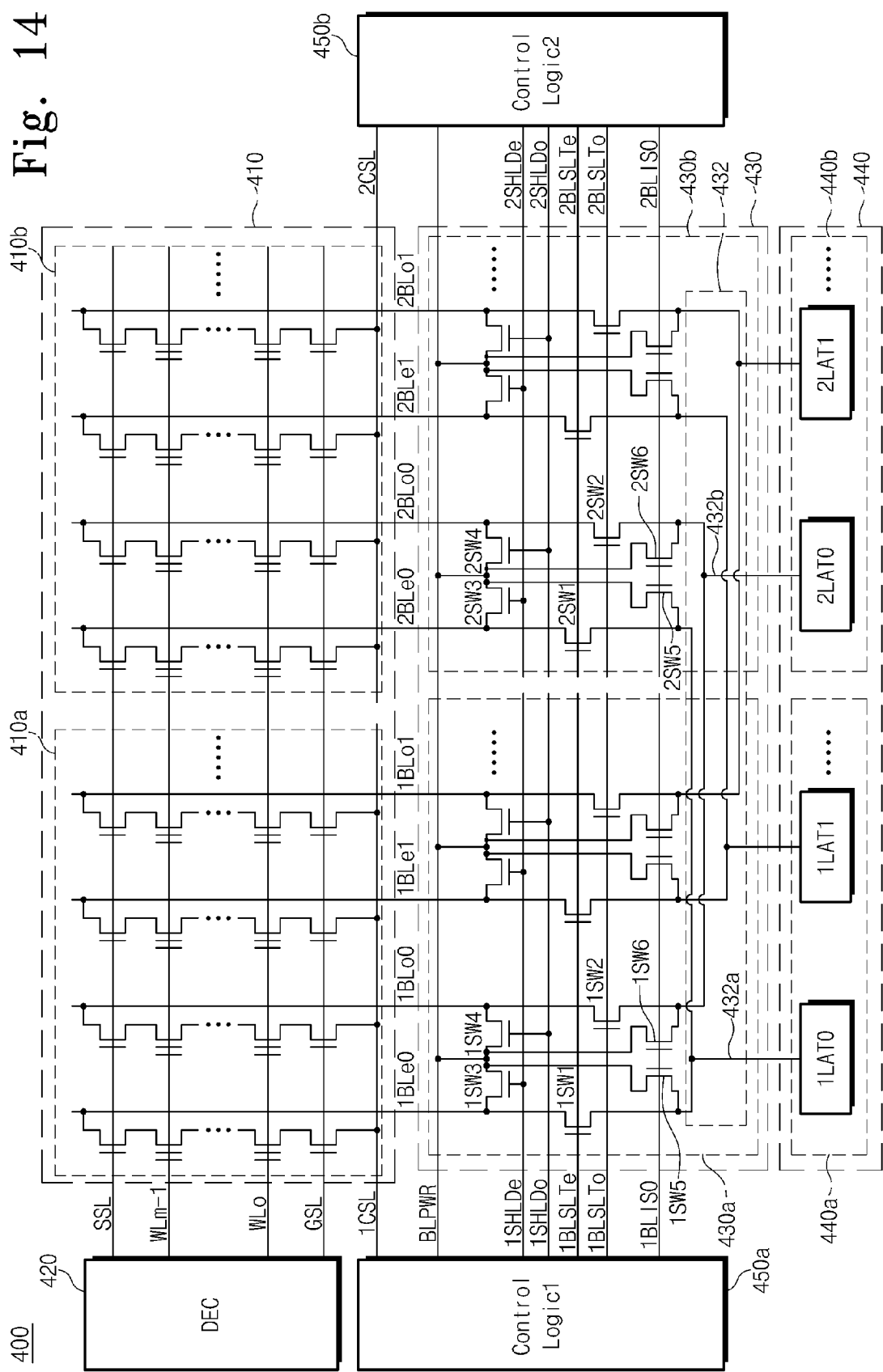
FIG. 14 is a circuit diagram showing a nonvolatile memory device, according to a fourth exemplary embodiment of the present invention.

FIG. 14 is a circuit diagram showing a nonvolatile memory device, according to a fourth exemplary embodiment of the present invention. In FIG. 14, nonvolatile memory device 400 combines the divided common source lines 1CSL and 2CSL with the structure of the exemplary embodiment shown in FIG. 7. Thus, for example, the nonvolatile memory device 400 also reduces read disturbance of the reading/verifying operation, as well as scales down a layout size of a bit-line switch circuit 430.

Figure 15:
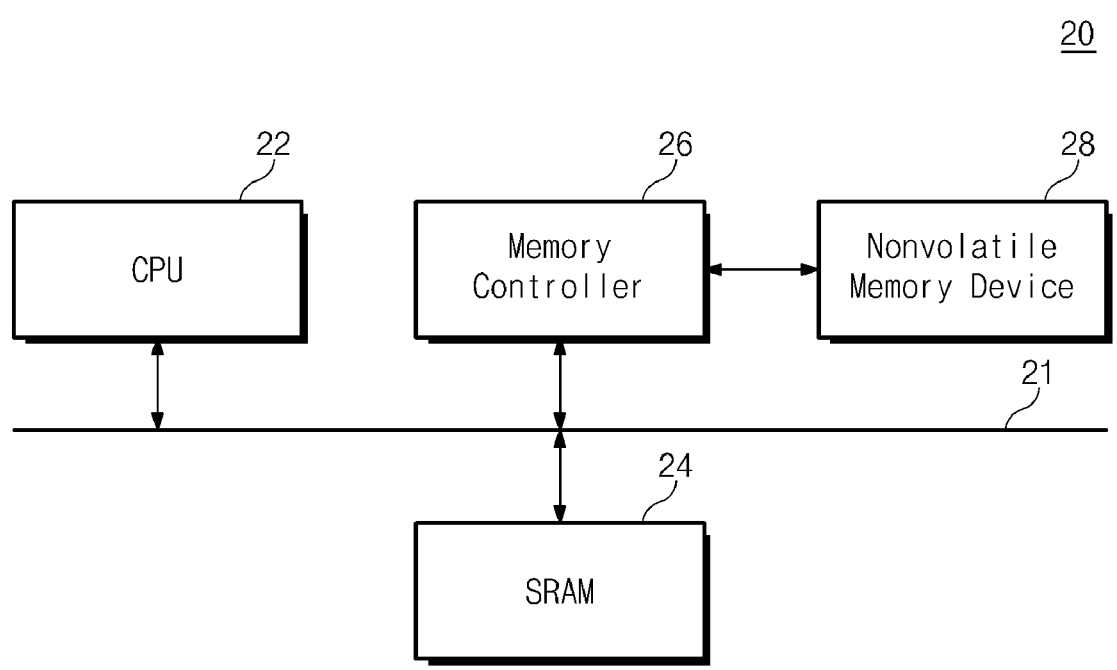
FIG. 15 is a block diagram showing an embedded memory system with a nonvolatile memory device, according to exemplary embodiments of the present invention.

FIG. 15 is a block diagram showing an embedded memory system 20 having a nonvolatile memory device, implemented in accordance with the various embodiments of the present invention. Referring to FIG. 15, the embedded memory system 20 includes a central processing unit (CPU) 22, a static RAM (SRAM) 24, a memory controller 26 and a nonvolatile memory device 28, all of which are electrically connected to each other through bus 21. The nonvolatile memory device 28 may be configured substantially as same described above, with respect to the exemplary embodiments shown in FIGS. 4, 7, 11 and/or 14. The nonvolatile memory system 28 may store N-bit data (where N is 1 or a positive integer larger than 1), which are processed or to be processed by the CPU 22 through the memory controller 26.

Although not shown in FIG. 15, the embedded memory system 20, according to various embodiments, may further include an application chip set, a camera image sensor (e.g., a complementary metal-oxide-semiconductor image sensor (CIS)), a mobile DRAM, etc. Also, the memory controller 26 and/or the nonvolatile memory device 28 may be even configured in a solid state drive or disk (SSD).

The nonvolatile memory device 28 and/or the memory controller 26 can be provided in the embedded memory system 20 by means of various types of packages. For instance, the nonvolatile memory device 28 and/or the memory controller 26 may be included in the embedded memory system 20 by any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WPP).

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory device comprising:
    a memory cell array comprising a plurality of memory cells arranged at intersections of word lines and bit lines, a first page region configured with at least two adjacent memory cells coupled to a word line, and a second page region configured with at least two adjacent memory cells coupled to the word line;
    a latch circuit for providing first page data to the first page region in response to a first address and subsequently providing second page data to the second page region in response to a second address; and
    a bit-line switch circuit between the memory cell array and the latch circuit, the bit-line switch circuit comprising a first bit-line switch circuit for selecting bit lines to load the first page data into the first page region in response to the first address during a programming operation, and a second bit-line switch circuit for selecting bit lines to load the second page data into the second page region in response to the second address,
    wherein the first address is different from the second address.

2. The nonvolatile memory device as set forth in claim 1, wherein the latch circuit comprises:
    a plurality of first latches, each of which is shared by a first pair of bit lines belonging to the first and second page regions, respectively; and
    a plurality of second latches, each of which is shared by a second pair of bit lines belonging to the first and second page regions, respectively.

3. The nonvolatile memory device as set forth in claim 2, wherein during the programming operation, the first bit-line switch circuit selects bit lines connected to the plurality of second latches after selecting bit lines connected to the plurality of first latches in response to the first address, and
    wherein during the programming operation, the second bit-line switch circuit selects bit lines connected to the plurality of first latches after selecting bit lines connected to the plurality of second latches in response to the second address.

4. The nonvolatile memory device as set forth in claim 2, wherein the first bit-line switch circuit comprises:
   first even switches selecting even bit lines of the first page region in response to a first selection signal; and
   first odd switches selecting odd bit lines of the first page region in response to a second selection signal; and
   wherein the second bit-line switch circuit comprises:
   second even switches selecting even bit lines of the second page region in response to a third selection signal; and
   second odd switches selecting odd bit lines of the second page region in response to a fourth selection signal.

5. The nonvolatile memory device as set forth in claim 4, wherein one of the first even switches and one of the first odd switches are formed in a single active region.

6. The nonvolatile memory device as set forth in claim 5, wherein the even and odd switches are separated from each other by isolation transistors.

7. The nonvolatile memory device as set forth in claim 6, wherein a voltage applied to a gate of each of the isolation transistors is equal to or less than a source-drain voltage of the isolation transistor to turn off each of the isolation transistors in a normal operation.

8. The nonvolatile memory device as set forth in claim 7, wherein the first bit-line switch circuit comprises:
   first even bit-line selection lines to which the first selection signal is transferred;
   first odd bit-line selection lines to which the second selection signal is transferred; and
   first bit-line isolation lines between the first even and odd bit-line selection lines that are arranged alternately;
   wherein the second bit-line switch circuit comprises:
   second even bit-line selection lines to which the third selection signal is transferred;
   second odd bit-line selection lines to which the fourth selection signal is transferred; and
   second bit-line isolation lines between the second even and odd bit-line selection lines that are arranged alternately; and
   wherein the first and second bit-line isolation lines transfer the voltage that is applied to the gates of the isolation transistors.

9. The nonvolatile memory device as set forth in claim 8, wherein the bit-line switch circuit further comprises:
   a first interconnection line leading from the first latch of the latch circuit; and
   a second interconnection line leading from the second latch of the latch circuit,
   wherein the first bit-line switch circuit further comprises a first active region in which the first interconnection line is connected to a first contact, the second interconnection line is connected to a second contact, and bit lines connected to at least two adjacent memory cells of the first page region are connected to third and fourth contacts;
   wherein the second bit-line switch circuit further comprises a second active region in which the first interconnection line is connected to a fifth contact, the second interconnection line is connected to a sixth contact, and bit lines connected to at least two adjacent memory cells of the second page region are connected to seventh and eighth contacts;
   wherein the first even bit-line selection line is positioned between the first and third contacts in an upper portion of the first active region and the first odd bit-line selection line is positioned between the second and fourth contacts in a lower portion of the first active region; and
   wherein the second even bit-line selection line is positioned between the fifth and seventh contacts in an upper portion of the second active region and the second odd bit-line selection line is positioned between the sixth and eighth contacts in a lower portion of the second active region.

10. The nonvolatile memory device as set forth in claim 9, further comprising:
    metal lines formed between the first interconnection line and the first and fifth contacts, and between the second interconnection line and the second and sixth contacts, intersecting the bit lines.

11. The nonvolatile memory device as set forth in claim 1, further comprising:
    a first control logic circuit operating to control the first bit-line switch circuit in response to the first address; and
    a second control logic circuit operating to control the second bit-line switch circuit in response to the second address.

12. The nonvolatile memory device as set forth in claim 11, wherein the first and second control logic circuits control the first and second bit-line switch circuits to select even and odd bit lines at the same time in response to a selected one of the addresses during a reading/verifying operation.

13. The nonvolatile memory device as set forth in claim 11, wherein the first and second control logic circuits control the first and second bit-line switch circuits to ground all of even and odd bit lines in response to a selected one of the addresses during a reading/verifying operation.

14. The nonvolatile memory device as set forth in claim 11, wherein the first and second control logic circuits are independently driven in compliance each of the first and second addresses.

* * * * *